(12) United States Patent
Wang et al.

(10) Patent No.: US 9,991,362 B2
(45) Date of Patent: Jun. 5, 2018

(54) SEMICONDUCTOR DEVICE INCLUDING TUNGSTEN GATE AND MANUFACTURING METHOD THEREOF

(71) Applicant: TAIWAN SEMICONDUCTOR MANUFACTURING CO., LTD., Hsinchu (TW)

(72) Inventors: Yu-Sheng Wang, Tainan (TW); Chi-Cheng Hung, Tainan (TW); Chia-Ching Lee, New Taipei (TW); Chung-Chiang Wu, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days. days.

(21) Appl. No.: 15/281,296

(22) Filed: Sep. 30, 2016

(65) Prior Publication Data

US 2018/0097084 A1    Apr. 5, 2018

(51) Int. Cl.
*H01L 29/66* (2006.01)
*H01L 29/49* (2006.01)
*H01L 21/285* (2006.01)

(52) U.S. Cl.
CPC .. *H01L 29/66545* (2013.01); *H01L 21/28556* (2013.01); *H01L 29/495* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,349,395 A | * | 9/1982 | Toyokura | H01L 21/28167 257/E21.193 |
| 6,331,483 B1 | * | 12/2001 | Ishizuka | C23C 16/0281 257/E21.17 |
| 2008/0003796 A1 | * | 1/2008 | Jeong | H01L 21/28562 438/597 |
| 2014/0027664 A1 | * | 1/2014 | Lei | C01B 35/146 252/62.3 R |
| 2015/0179461 A1 | * | 6/2015 | Bamnolker | H01L 21/28556 438/656 |

OTHER PUBLICATIONS

Yang, Tao et al., "ALD W CMP for HKMG", Key Leboratory of Microelectronics Devices & Integrated Technology, Institute of Microelectronics of Chinese Academy of Sciences, Beijing, China; ECS Transactions, 58 (9) pp. 49-52, 2013.

* cited by examiner

*Primary Examiner* — Mamadou Diallo
(74) *Attorney, Agent, or Firm* — McDermott Will & Emery LLP

(57) ABSTRACT

In a method of manufacturing a tungsten layer by an atomic layer deposition, a seed layer on an underlying layer is formed on a substrate by supplying a boron containing gas and a dilute gas, and a tungsten layer is formed on the seed layer by supplying a tungsten containing gas. A flow ratio of a flow amount of the boron containing gas to a total flow amount of the boron containing gas and the dilute gas is in a range from 1/21 to 1/4.

20 Claims, 7 Drawing Sheets

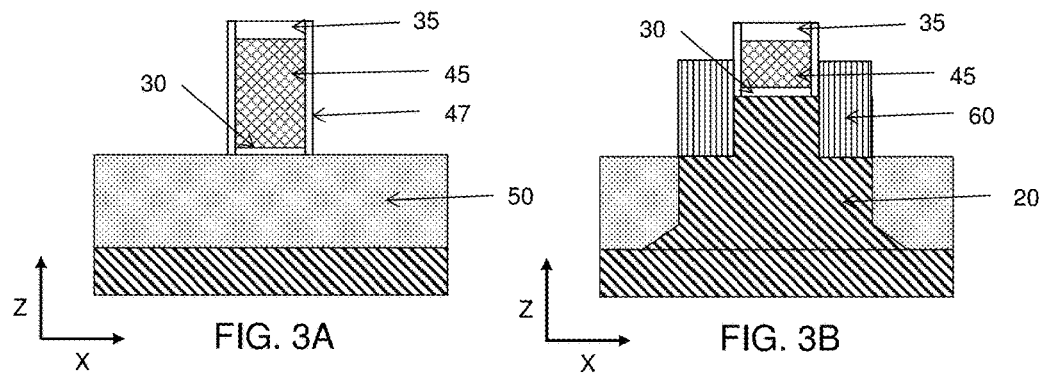
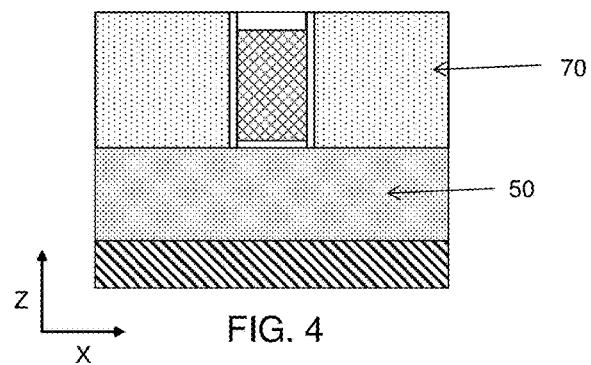
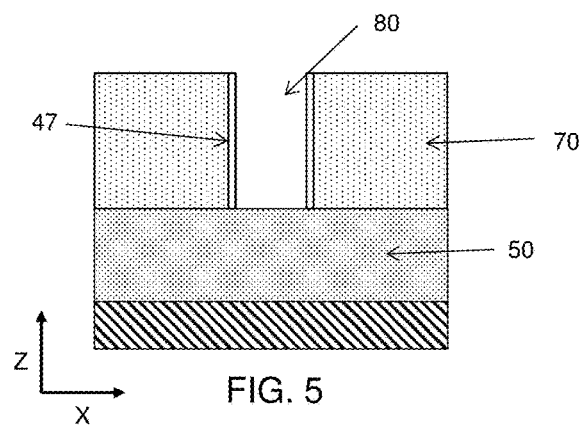

US 9,991,362 B2

SEMICONDUCTOR DEVICE INCLUDING TUNGSTEN GATE AND MANUFACTURING METHOD THEREOF

TECHNICAL FIELD

The disclosure relates to a semiconductor integrated circuit, more particularly to a semiconductor device having a metal gate structure and its manufacturing process.

BACKGROUND

As the semiconductor industry has progressed into nanometer technology process nodes in pursuit of higher device density, higher performance, and lower costs, challenges from both fabrication and design issues have resulted in the use of a metal gate structure with a high-k (dielectric constant) material. The metal gate structure is often manufactured by using gate replacement technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-9, 11 and 12 show exemplary views of various stages for manufacturing a semiconductor FET device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
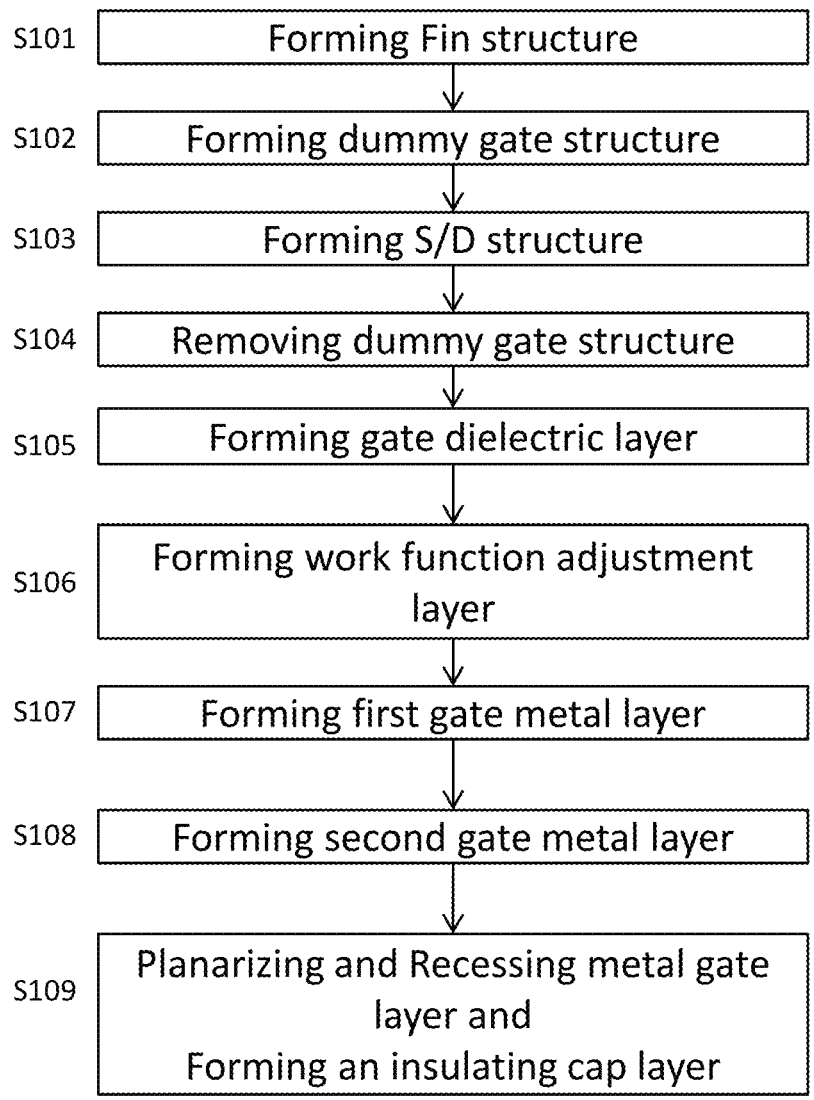
FIG. 1 is an exemplary flow chart for manufacturing a semiconductor FET device according to one embodiment of the present disclosure.

FIG. 1 is an exemplary flow chart for manufacturing a semiconductor FET device having a fin structure (Fin FET). The flow chart illustrates only a relevant part of the entire manufacturing process for a Fin FET device. It is understood that additional operations may be provided before, during, and after the operations shown by FIG. 1, and some of the operations described below can be replaced or eliminated for additional embodiments of the method. The order of the operations/processes may be interchangeable.

Figure 2A:
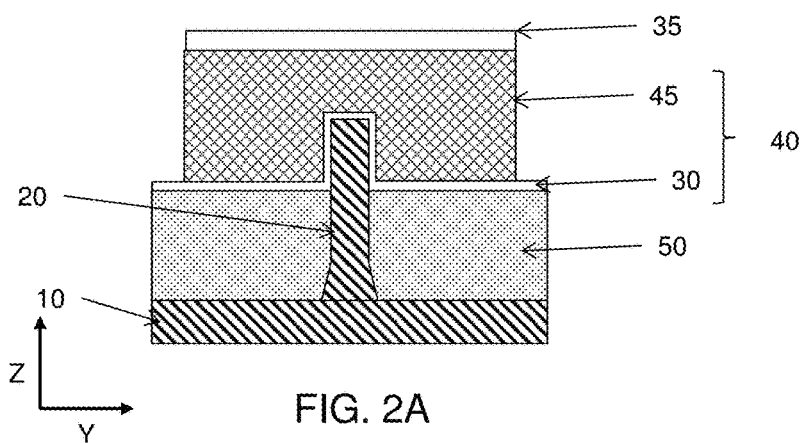
Figures 2B, 2C:
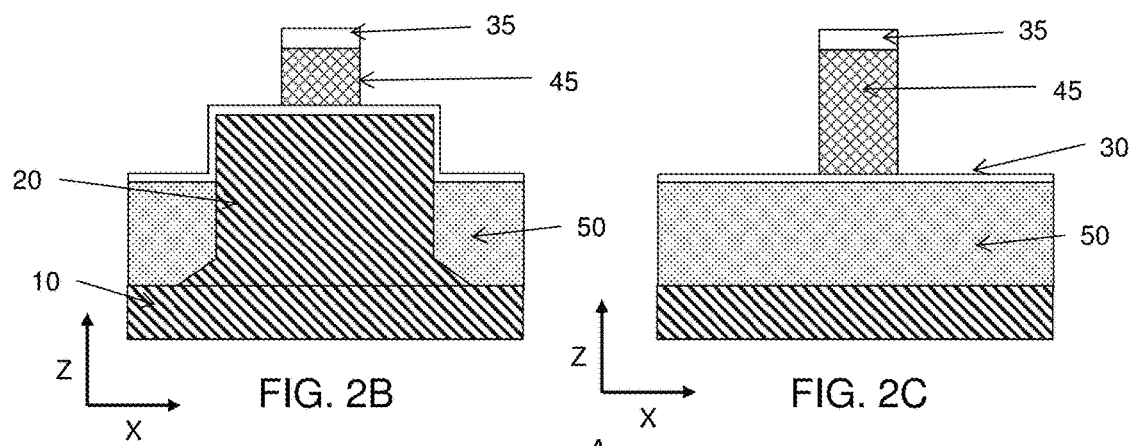
Figure 2D:
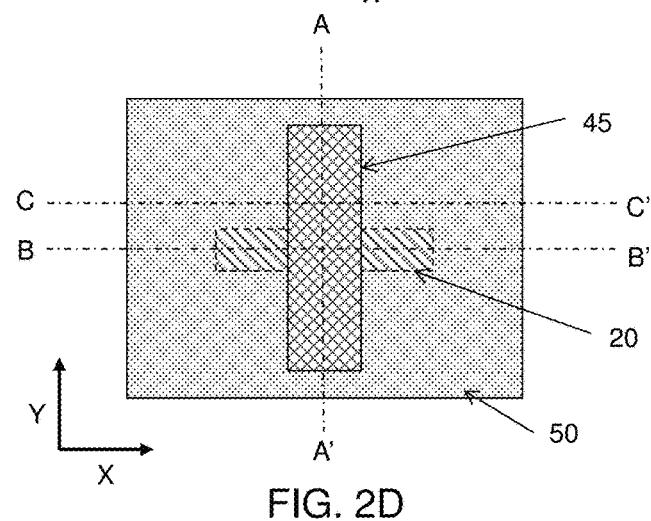

FIGS. 2A-2C are exemplary cross sectional views of the Fin FET device at one of the various stages of the fabrication process according to one embodiment. FIG. 2D is a planar view, FIG. 2A is a cross sectional view along the line A-A' of FIG. 2D, FIG. 2B is a cross sectional view along the line B-B' of FIG. 2D and FIG. 2C is a cross sectional view along the line C-C' of FIG. 2D.

In S101 of FIG. 1, a fin structure 20 is fabricated over a substrate 10. The fin structure 20 is formed over a substrate 10 and protrudes from an isolation insulating layer 50. The portion of the fin structure 20 protruding from the isolation insulating layer 50 functions as a channel layer.

To fabricate a fin structure according to one embodiment, a mask layer is formed over a substrate 10. The mask layer is formed by, for example, a thermal oxidation process and/or a chemical vapor deposition (CVD) process. The substrate 10 is, for example, a p-type silicon substrate with an impurity concentration in a range of about $1 \times 10^{15}$ cm$^{-3}$ to about $2 \times 10^{15}$ cm$^{-3}$. In other embodiments, the substrate 10 is an n-type silicon substrate with an impurity concentration in a range of about $1 \times 10^{15}$ cm$^{-3}$ to about $2 \times 10^{15}$ cm$^{-3}$. The mask layer includes, for example, a pad oxide (e.g., silicon oxide) layer and a silicon nitride mask layer in some embodiments.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range of about 5 nm to about 40 nm in some embodiments. In certain embodiments, the width of the hard mask patterns is in a range of about 7 nm to about 12 nm.

By using the hard mask pattern as an etching mask, the substrate is patterned into a fin structure 20 by trench etching using a dry etching method and/or a wet etching method. A height of the fin structure 20 is in a range of about 20 nm to about 300 nm. In certain embodiments, the height is in a range of about 30 nm to about 60 nm. When the heights of the fin structures are not uniform, the height from the substrate may be measured from the plane that corresponds to the average heights of the fin structures. The width of the fin structure 20 is in a range of about 7 nm to about 15 nm.

In this embodiment, a bulk silicon wafer is used as the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

As shown in FIGS. 2A-2D, one fin structure 20 extending in the X direction is disposed over the substrate 10. However, the number of the fin structure is not limited to one. The numbers may be two, three, four or five or more. In addition, one or more dummy fin structures may be disposed adjacent to both sides of the fin structure 20 to improve pattern fidelity in the patterning processes. The width of the fin structure 20 is in a range of about 5 nm to about 40 nm in some embodiments, and is in a range of about 7 nm to about 15 nm in certain embodiments. When multiple fin structures are disposed, the space between the fin structures is in a range of about 5 nm to about 80 nm in some embodiments, and is in a range of about 7 nm to about 15 nm in other embodiments. One skilled in the art will realize, however, that the dimensions and values recited throughout the descriptions are merely examples, and may be changed to suit different scales of integrated circuits.

In this embodiment, the Fin FET device is a p-type Fin FET. However, the technologies disclosed herein are also applicable to an n-type Fin FET.

After forming the fin structure 20, an isolation insulating layer 50 is formed over the fin structure 20.

The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process in some embodiments. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

After forming the isolation insulating layer 50, a thermal process, for example, annealing, may be performed to improve the quality of the isolation insulating layer 50. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient. The annealing may be performed after the planarization operation as set forth below.

After forming the isolation insulating layer 50 over the fin structure 20, a planarization operation is performed so as to remove part of the isolation insulating layer 50 and the mask layer (the pad oxide layer and the silicon nitride mask layer). The planarization operation may include a chemical mechanical polishing (CMP) and/or an etch-back process. Then, the isolation insulating layer 50 is further removed so that the channel layer (upper layer) of the fin structure 20 is exposed.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process. For example, a dry etching process using $CHF_3$ or $BF_3$ as etching gases may be used.

In S102 of FIG. 1, a dummy gate structure 40 is formed over part of the fin structure 20 as shown in FIGS. 2A-2D.

A dielectric layer and a poly silicon layer are formed over the isolation insulating layer 50 and the exposed fin structure, and then patterning operations are performed so as to obtain a dummy gate structure 40 including a dummy gate electrode layer 45 made of poly silicon and a dummy gate dielectric layer 30. The patterning of the poly silicon layer is performed by using a hard mask 35 including a silicon nitride layer formed over a silicon oxide layer in some embodiments. In other embodiments, the hard mask includes a silicon oxide layer formed over a silicon nitride layer. The dummy gate dielectric layer 30 may be silicon oxide formed by CVD, PVD, ALD, e-beam evaporation, or other suitable process. In some embodiments, the dummy gate dielectric layer 30 may include one or more layers of silicon oxide, silicon nitride, silicon oxy-nitride, or high-k dielectrics. In some embodiments, a thickness of the gate dielectric layer is in a range of about 0.5 nm to about 2 nm, and in a range of about 0.5 nm to about 1 nm in other embodiments.

In some embodiments, the dummy gate electrode layer 45 may comprise a single layer or multilayer structure. The dummy gate electrode layer 45 may be doped poly silicon with uniform or non-uniform doping. The dummy gate electrode layer 45 may be formed using a suitable process such as ALD, CVD, PVD, plating, or combinations thereof. In the present embodiment, the width of the dummy gate electrode layer 45 is in the range of about 30 nm to about 60 nm. In some embodiments, a thickness of the gate electrode layer is in a range of about 20 nm to about 400 nm, and is in a range of about 50 nm to 150 nm in other embodiments.

As shown in FIG. 3A, side-wall insulating layers 47 are formed over both main sides of the dummy gate electrode 45. FIG. 3A is an exemplary cross sectional view corresponding to line C-C' of FIG. 2D at one of the various stages of the fabrication process according to one embodiment.

The side-wall insulating layers 47 may include silicon oxide, silicon nitride, silicon oxy-nitride, or other suitable material. The side-wall insulating layers 47 may comprise a single layer or multilayer structure. A blanket layer of a side-wall insulating material may be formed by CVD, PVD, ALD, or other suitable technique. Then, an anisotropic etching is performed on the side-wall insulating material to form a pair of side-wall insulating layers (spacers) 47 on two main sides of the gate structure. The thickness of the side-wall insulating layers 47 is in a range of about 5 nm to about 30 nm in some embodiments, and in a range of about 10 nm to about 20 nm in other embodiments.

In S103 of FIG. 1, a source and a drain 60 are formed as shown in FIG. 3B. FIG. 3B is an exemplary cross sectional view corresponding to line B-B' of FIG. 2D at one of the various stages of the fabrication process according to one embodiment. The source and drain 60 may include a strain layer to apply stress to the channel layer. In some embodiments, the portions of the upper layer of the fin structure 20 not covered by the dummy gate structure 40 are etched down to form a recessed portions. Then, an appropriate strain layer is formed in the recessed portions. In some embodiments, the strain layer includes a single layer or multiple layers including SiGe for a p-type FET and SiP, SiC or SiCP for an n-type FET. The strain layer is epitaxially formed in the recessed portions.

As shown in FIG. 4 corresponding to line B-B' of FIG. 2, an interlayer dielectric (ILD) layer 70 is formed over the dummy gate structure 40 with the side wall insulating layers 47.

A dielectric material is formed over the dummy gate structure and the isolation insulating layer 50, and planarization operations, such as an etch back process and/or a chemical mechanical polishing (CMP) process, are performed, so as to obtain the structure shown in FIG. 4. The dielectric material for the interlayer dielectric layer 70 may include one of more layers of silicon oxide, silicon nitride, silicon oxynitride (SiON), SiOCN, fluorine-doped silicate glass (FSG), or a low-K dielectric material. The insulating material for the interlayer dielectric layer 70 may be the same as or different from that for the isolation insulating layer 50.

In S104 of FIG. 1, after the interlayer dielectric layer 70 is formed, as shown in FIG. 5, the dummy gate structure 40 is removed by dry etching and/or wet etching, so that a space 80 is formed. The depth of the space 80 is in a range of about 50 nm to about 400 nm, and may be in a range of about 100 nm to 200 nm. An aspect ratio of the space 80 may be in a range of 0.5 to 20 in some embodiments. As shown in FIG. 5, the side-wall insulating layers 47 remain in the space 80. In some embodiments, the side-wall insulating layers 47 are removed when removing the dummy gate structure 40.

Figure 6:
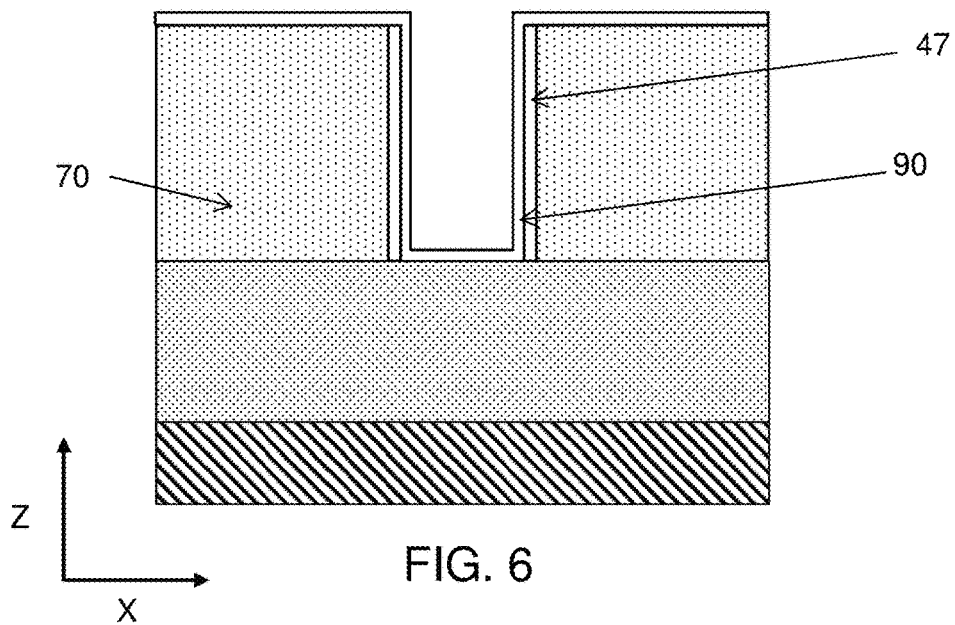

In S105 of FIG. 1, a gate dielectric layer 90 is formed in the space 80, as shown in FIG. 6. A gate dielectric layer 90 is formed over an interface layer (not shown) disposed over the channel layer of the fin structure 20. The interface layer may include silicon oxide with a thickness of 0.2 nm to 1.5 nm in some embodiments. The silicon oxide interface layer may be formed by oxidizing the Si channel layer. In other embodiments, the thickness of the interface layer is in a range about 0.5 nm to about 1.0 nm. In certain embodiments, the interface layer is not formed.

The gate dielectric layer 90 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 90 is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer 90 is in a range of about 0.5 nm to about 5 nm in some embodiments, and is in a range of about 1 nm to about 3 nm in other embodiments. In some embodiments, the gate dielectric layer 90 may include an interfacial layer made of silicon dioxide. The gate dielectric layer 90 is also formed on the upper surface of the interlayer dielectric layer 70.

Figure 7:
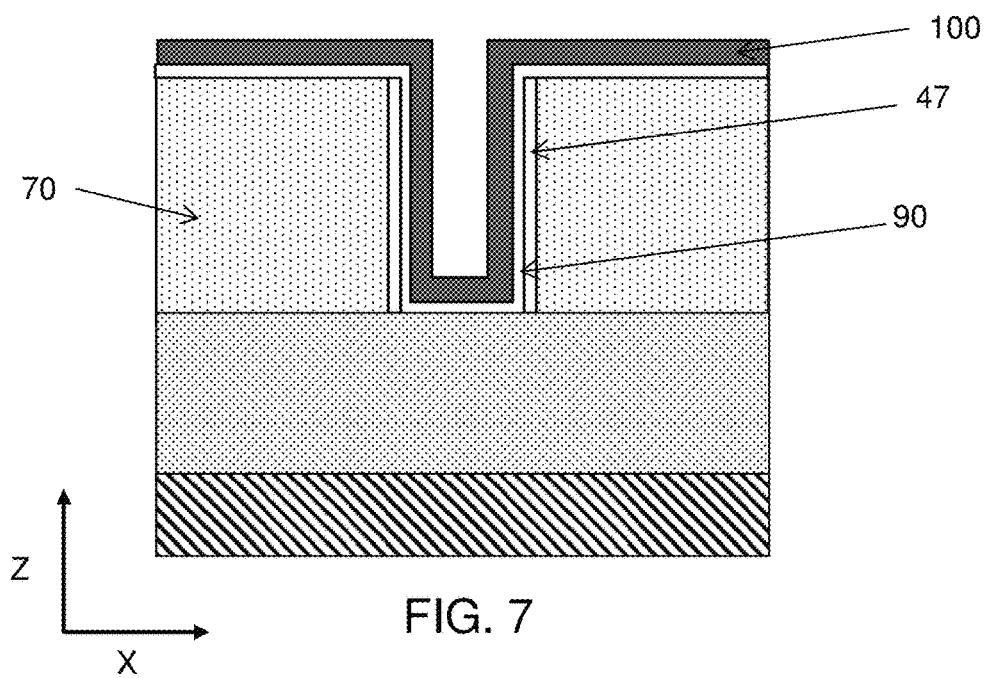

In S106 of FIG. 1, a work function adjustment layer 100 is formed over the gate dielectric layer in the space 80, as shown in FIG. 7. The work function adjustment metal layer 100 includes one or more layers of metal materials, such as TiN, TaN, TaAlC, TiC, TaC, Co, Al, TiAl, HfTi, TiSi, TaSi or TiAlC. In some embodiments, the work function adjustment layer 100 includes TiAl and TiN and has a thickness in a range from about 3 nm to about 5 nm.

Further, in certain embodiments, before forming the work function adjustment metal layer 100, a capping layer made of, for example, TiN doped with Si is formed on the gate dielectric layer 90, and a barrier layer made of, for example, TaN, is formed on the capping layer (both are not shown). The capping layer may be formed by CVD, PVD or ALD and the thickness of the capping layer is in a range from about 0.5 nm to about 1.5 nm in some embodiments. The barrier layer may be formed by CVD, PVD or ALD and the thickness of the capping layer is in a range from about 0.5 nm to about 2 nm in some embodiments.

Figure 8:
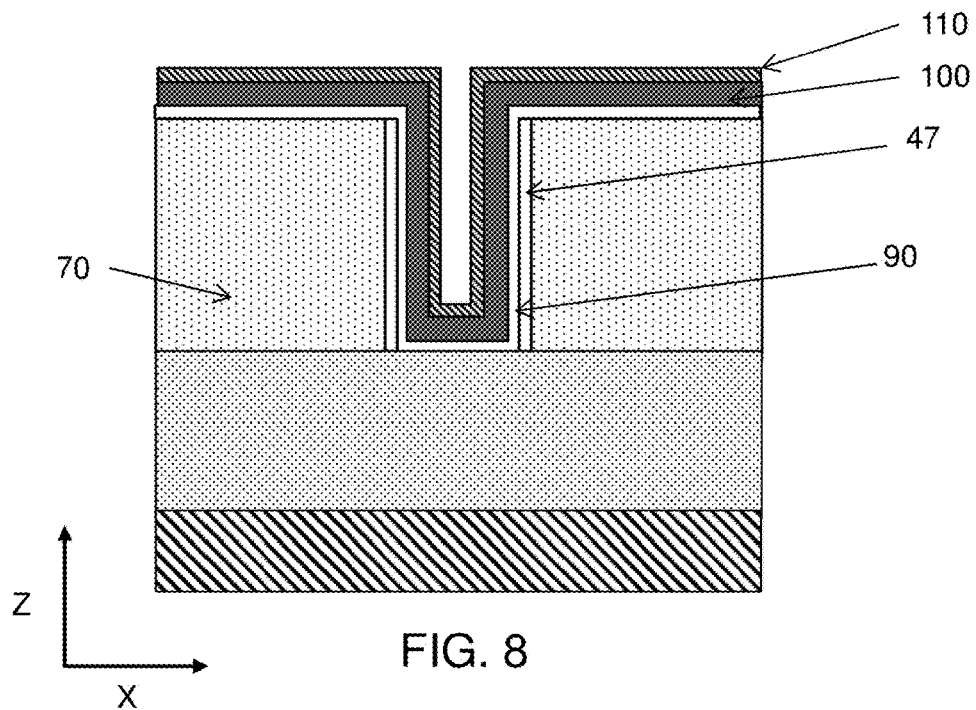

In S107 of FIG. 1, a first gate metal layer 110 is formed over the work function adjustment layer 100, as shown in FIG. 8. In certain embodiments, a block layer (not shown) made of, for example, TiN, is formed on the work function adjustment layer 100 before forming the first gate metal layer 110.

The first gate metal layer 110 includes one or more layers of any suitable metal materials, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In this embodiment, tungsten (W) is used as the first gate metal layer 110 to form a first W layer. The first W layer 110 is formed by a ALD using $WCl_5$ and $H_2$ as source gases at a temperature of about 400° C. to about 500° C. in some embodiments. Since no fluorine source gas is used, the first W layer 110 is fluorine free layer. The thickness of the first W layer 110 is in a range from about 2 nm to about 5 nm in some embodiments. As shown in FIG. 8, the metal material (W) of the first gate metal layer 110 does not fully fill the space 80.

Figure 9:
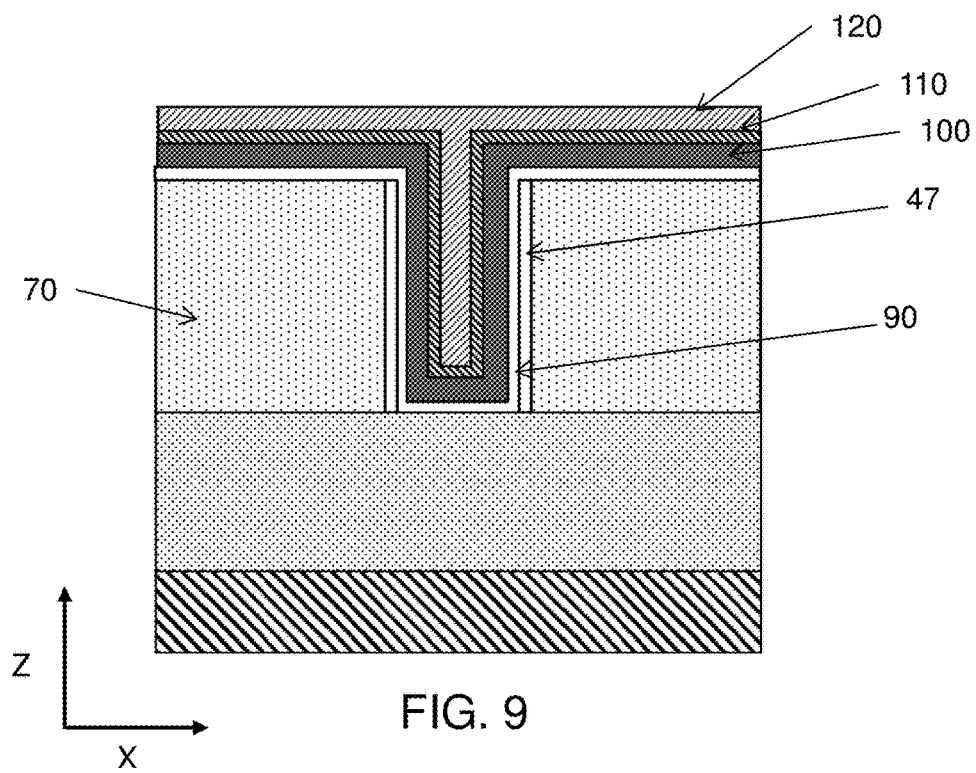

Further, in S108 of FIG. 1, a second gate metal layer 120 is formed over the first gate metal layer 110, as shown in FIG. 9. Similar materials to the first metal gate layer 110 can be employed by the second metal gate layer 120.

In this embodiment, tungsten (W) is used as the second gate metal layer 120. The second W layer 120 is formed by an ALD using a tungsten source gas and a dilute (carrier) gas. In some embodiments, $WF_6$ is used as the W source gas and $H_2$ as the dilute gas. Ar or other inert gas may be used as the dilute gas.

Figure 10A:
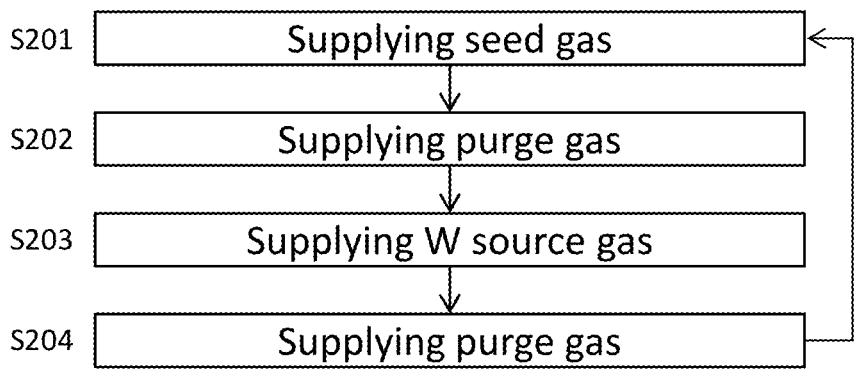
FIGS. 10A and 10B show an exemplary flow for an ALD (atomic layer deposition) operation according to one embodiment of the present disclosure.
Figure 10B:
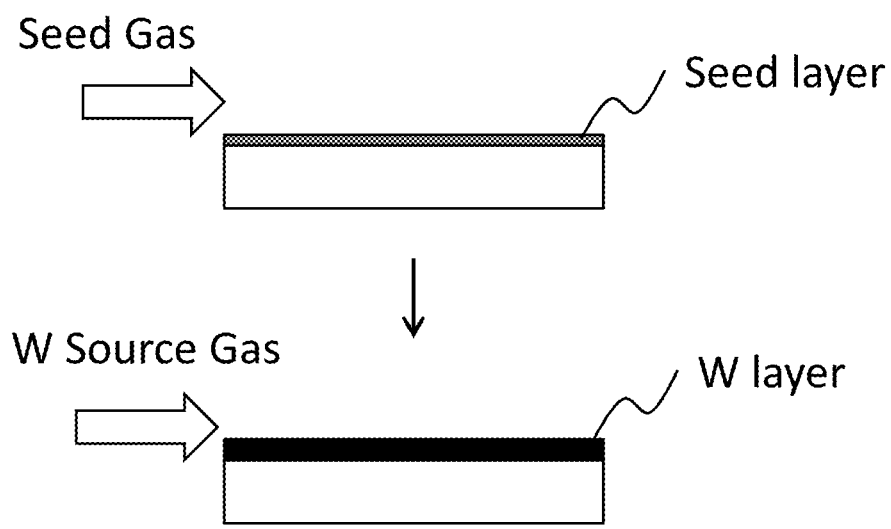

FIG. 10A shows an exemplary flow chart for an ALD operation for forming the second W layer 120 according to one embodiment of the present disclosure. FIG. 10B shows exemplary cross sectional views of the W ALD operation.

In S201 of the ALD deposition, a seed gas for forming a seed layer is supplied over the underlying layer (e.g., the first W layer 110), and in S202, after the seed gas is supplied, a purge gas, for example, $H_2$ and/or Ar is supplied over the seed layer to purge excess seed gas. When the purge gas is supplied, the seed gas is stopped. The seed gas is one or more of $B_2H_6$ and $SiH_4$ diluted with the dilute gas (e.g., $H_2$) in some embodiments. The seed layer is an atomic layer of B and/or Si. The purge gas in S202 is supplied for a time duration in a range from about 5 sec to 25 sec in some embodiments, and is in a range from 10 sec to 20 sec in other embodiments.

In S203, the W source gas ($WF_6$) is supplied over the seed layer, and in S204, after the W source gas is supplied, a purge gas, for example, $H_2$ and/or Ar is supplied over the W layer to purge excess source gas, to form an atomic layer of W. When the purge gas is supplied, the W source gas is stopped. The flow rate of the W source gas ($WF_6$) is in a range from about 30 sccm to about 100 sccm in some embodiments. During the ALD operation, the substrate is heated at a temperature in a range from about 300° C. to 500° C. in some embodiments.

After the mono-layer of W is formed, the operations of S201-S204 are repeated to obtain a second W layer 120 having a desired thickness. The thickness of the second W layer 120 is in a range from about 1 nm to about 5 nm in some embodiments, and is in a range from about 2 nm to 3 nm in other embodiments.

In this embodiment, to reduce boron (B) concentration in the second W layer 120, a ratio of the $B_2H_6$ as the seed gas to the total gas flow (the seed gas and the dilute gas) is adjusted. In particular, a higher amount of the dilute gas with respect to the seed gas is used. For example, a flow ratio of a flow amount of the boron containing gas to a total flow amount of the boron containing gas and the dilute gas is in a range from about 1/21 to about 1/4, in some embodiments. In certain embodiments, the ratio is in a range from about 1/21 to about 1/6, and in such cases. This means that when the flow rate (flow amount) of the dilute gas (e.g., $H_2$) is, for example, 2000 sccm, the flow rate of $B_2H_6$ is in a range from about 100 sccm to 400 sccm. In other embodiments, the ratio is in a range from about 1/11 to about 1/6.

It is also possible to define a gas ratio as a flow rate (flow amount) of the $B_2H_6$ gas with respect to the dilute gas (e.g., $H_2$). In such a case, the gas ratio is in a range from about 1/20 to 1/5. This means that when the flow rate of the dilute gas is 2000 sccm, the flow rate of $B_2H_6$ is in a range from about 100 sccm to 400 sccm. In other embodiments, the gas ratio is in a range from about 1/10 to about 1/5. Of course, the flow rate of the dilute gas may vary and is in a range from about 500 sccm to 4000 sccm in some embodiments and is in a range from about 800 sccm to about 2000 sccm in other embodiments.

By utilizing the higher amount of the dilute gas with respect to the seed gas (or the relatively lower amount of the seed gas), a boron concentration in the second W layer can be reduced to a range of about 20 atomic % to about 27 atomic % compared with a case in which a smaller amount of the dilute gas is used.

When the flow ratio of a flow amount of the $B_2H_6$ gas to a total flow amount of $B_2H_6$ gas and the $H_2$ gas is more than 1/4 (e.g., 1/3), the boron concentration is about 30 atomic % or more. If the boron concentration in a W layer is high, damage (e.g., erosion) will be caused in the W layer when the W layer is planarized by CMP (see, FIG. 11). However, by reducing the amount of boron in the W layer, it is possible to prevent such damage in the CMP operation.

It is also possible to make the purging time after the seed $B_2H_6$ gas is supplied longer to reduce the amount of boron in the W layer. As set forth above, the purging time by the $H_2$ or Ar is in a range from about 5 sec to 25 sec in some embodiments, and is in a range from 10 sec to 20 sec in other embodiments.

In a certain embodiment, a silicon containing gas, such as $SiH_4$ or $Si_2H_6$, is used as a seed gas instead of or in addition to the $B_2H_6$ gas. By adding a silicon containing gas, the flow amount of the boron containing gas can further be reduced, thereby further reducing the boron concentration in the W layer.

When $SiH_4$ gas is added to $B_2H_6$ seed gas as seed gases, a flow ratio of the flow amount of the seed gas ($B_2H_6+SiH_4$) to a total flow amount of the $B_2H_6$ seed gas, the $SiH_4$ seed gas and the dilute gas (e.g., $H_2$) is set in a range from about 1/21 to about 1/3 in some embodiments. A ratio of the flow amount of the $B_2H_6$ seed gas and the flow amount of the $SiH_4$ seed gas is in a range from about 9:1 to about 1:9 in some embodiments, and is in a range from about 4:6 to about 6:4 in other embodiments. A flow ratio of the flow amount of the $B_2H_6$ seed gas to a total flow amount of the $B_2H_6$ seed gas, the $SiH_4$ seed gas and the dilute gas (e.g., $H_2$) is set in a range from 1/40 to 1/10 in some embodiments, and is in a range from about 1/40 to about 1/25 in other embodiments.

When a silicon containing gas is used in addition to a boron containing gas as seed gas, a boron concentration in the W layer formed by ALD is in a range from about 1 atomic % to about 20 atomic % in some embodiments, and is in a range from about 5 atomic % to about 10 atomic % in other embodiments. If only $SiH_4$ gas is used as a seed gas, a boron concentration in the W layer formed by ALD is substantially zero.

Figure 11:
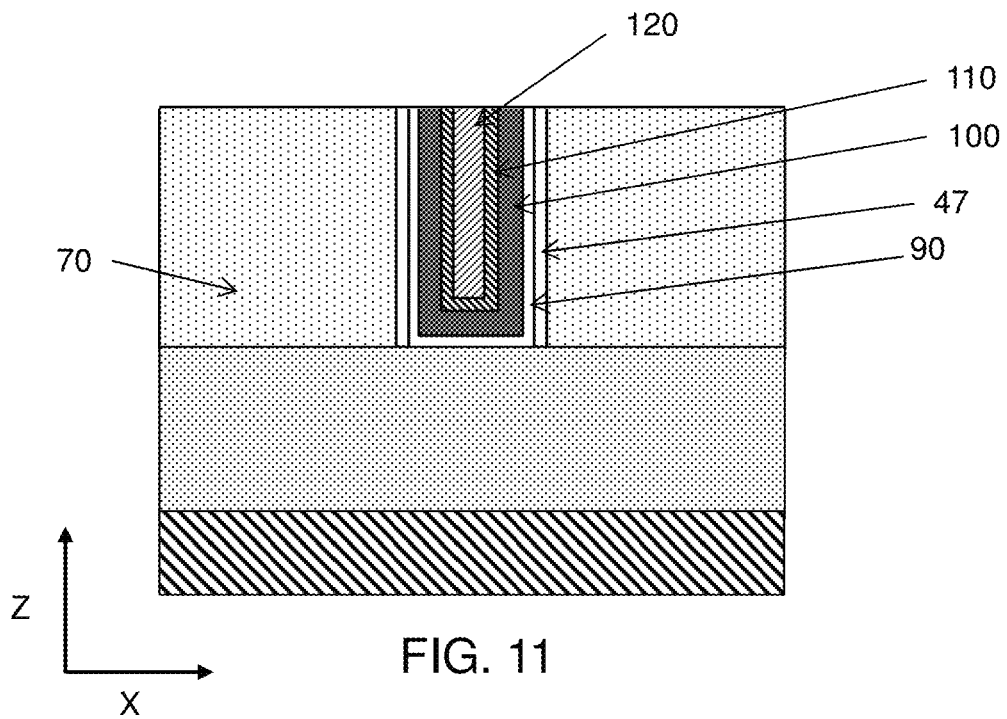
Figure 12:
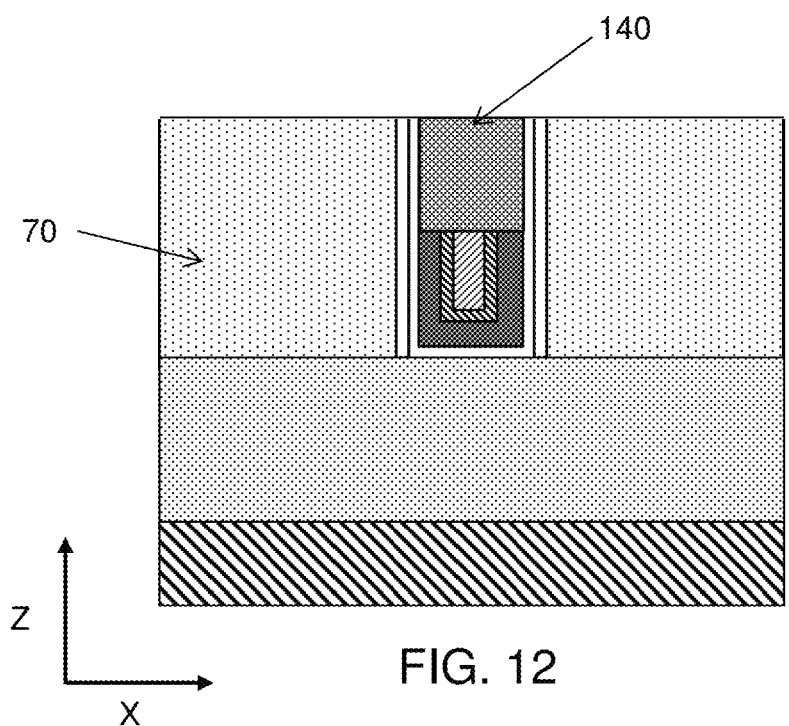

In S109 of FIG. 1, after the second W layer 120 is formed, a planarization operation, such as CMP, is performed such that the metal layers formed over the upper surface of the ILD layer 70 are removed, as shown in FIG. 11. In some embodiments, the gate dielectric layer 90 formed over the upper surface of the ILD layer 70 is also removed. Further, the metal gate layers formed in the space 80 are partially removed (recessed), and an insulating cap layer 140 is formed as shown in FIG. 12 in some embodiments. The insulating cap layer 140 is made of, for example, a silicon nitride layer, formed by CVD or ALD. A planarization operation such as CMP may be performed after the deposition of silicon nitride.

It is understood that the structure shown in FIG. 12 may undergo further CMOS processes to form various features such as contacts/vias, interconnect metal layers, dielectric layers, passivation layers, etc.

In the foregoing embodiments, a Fin FET device as an FET is fabricated. In other embodiments, the foregoing metal gate structure and method for fabrication thereof can be applied to a planar type FET.

In the present disclosure, a concentration of boron in a tungsten layer formed by ALD is reduced by reducing the amount of a boron containing gas as a seed gas with respect to the total gas amount. A boron concentration in the tungsten layer is in a range from about 1 atomic % to about 27 atomic %. A low boron concentration tungsten layer is more durable against a subsequent CMP operation, thereby improving reliability of a semiconductor device.

It will be understood that not all advantages have been necessarily discussed herein, no particular advantage is required for all embodiments or examples, and other embodiments or examples may offer different advantages.

In accordance with one aspect of the present disclosure, in a method of manufacturing a tungsten layer by an atomic layer deposition, a seed layer on an underlying layer is formed on a substrate by supplying a boron containing gas and a dilute gas, and a tungsten layer on the seed layer by supplying a tungsten containing gas. A flow ratio of a flow amount of the boron containing gas to a total flow amount of the boron containing gas and the dilute gas is in a range from 1/21 to 1/4.

In accordance with another aspect of the present disclosure, in a method of manufacturing a semiconductor device, a dummy gate structure is formed over a substrate. An interlayer insulating layer is formed over the dummy gate structure and the substrate. The dummy gate structure is removed so that a space corresponding to the dummy gate structure is formed. A gate dielectric layer is formed in the space. A first metal layer is formed on the gate dielectric in the space. A second metal layer is formed over the first metal layer. In the forming the second metal layer, a seed layer is formed over the barrier layer by supplying a boron containing gas and a dilute gas. A tungsten layer is formed on the seed layer by supplying a tungsten containing gas. The forming the seed layer and the forming the tungsten layer are repeated. A flow ratio of a flow amount of the boron containing gas to a total flow amount of the boron containing gas and the dilute gas is in a range from 1/21 to 1/4.

In accordance with another aspect of the present disclosure, a semiconductor device comprising an FET is provided. The FET includes a metal gate structure. The metal gate structure includes a gate dielectric layer, and a tungsten layer disposed over the gate dielectric layer. The tungsten layer contains boron, and a boron concentration in the tungsten layer is in a range from 1 atomic % to 27 atomic %.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a tungsten layer by an atomic layer deposition, comprising:
   forming a seed layer on an underlying layer formed on a substrate by supplying a boron containing gas and a dilute gas; and
   forming a tungsten layer on the seed layer by supplying a tungsten containing gas, wherein a flow ratio of a flow amount of the boron containing gas to a total flow amount of the boron containing gas and the dilute gas is in a range from 1/21 to 1/4.

2. The method of claim 1, wherein the ratio is in a range from 1/21 to 1/6.

3. The method of claim 1, wherein the boron containing gas is $B_2H_6$.

4. The method of claim 1, wherein the dilute gas is at least one of $H_2$ and Ar.

5. The method of claim 1, wherein the forming the seed layer and the forming the tungsten layer are repeated to form the tungsten layer.

6. The method of claim 1, wherein a boron concentration in the tungsten layer is in a range from 20 atomic % to 27 atomic %.

7. The method of claim 1, further comprising, between the forming the seed layer and the forming the tungsten layer, supplying a purge gas over the substrate.

8. The method of claim 7, wherein the purge gas is supplied for 10 seconds to 20 seconds.

9. The method of claim 1, wherein the forming a seed layer includes supplying a silicon containing gas together with the boron containing gas and the dilute gas.

10. The method of claim 9, wherein the silicon containing gas is $SiH_4$.

11. The method of claim 9, wherein a flow ratio of the flow amount of the boron containing gas to a total flow amount of the boron containing gas, the silicon containing gas and the dilute gas is in a range from 1/40 to 1/10.

12. The method of claim 9, wherein a boron concentration in the tungsten layer is in a range from 1 atomic % to 20 atomic %.

13. A method of manufacturing a semiconductor device, the method comprising:
   forming a dummy gate structure over a substrate;
   forming an interlayer insulating layer over the dummy gate structure and the substrate;
   removing the dummy gate structure so that a space corresponding to the dummy gate structure is formed;
   forming a gate dielectric layer in the space;
   forming a first metal layer on the gate dielectric in the space; and
   forming a second metal layer over the first metal layer, wherein:
   the forming the second metal layer includes:
      forming a seed layer over the first metal layer by supplying a boron containing gas and a dilute gas;
      forming a tungsten layer on the seed layer by supplying a tungsten containing gas; and
      repeating the forming the seed layer and the forming the tungsten layer,
   a flow ratio of a flow amount of the boron containing gas to a total flow amount of the boron containing gas and the dilute gas is in a range from 1/21 to 1/4.

14. The method of claim 13, wherein:
   the boron containing gas is $B_2H_6$, and
   the dilute gas is at least one of $H_2$ and Ar.

15. The method of claim 13, wherein a boron concentration in the tungsten layer is in a range from 10 atomic % to 27 atomic %.

16. The method of claim 13, further comprising, between the forming the seed layer and the forming the tungsten layer, supplying a purge gas over the substrate.

17. The method of claim 16, wherein the purge gas is supplied for 10 seconds to 20 seconds.

18. The method of claim 14, wherein the forming a seed layer includes supplying $SiH_4$ gas together with the boron containing gas and the dilute gas.

19. The method of claim 13, wherein a flow ratio of the flow amount of the boron containing gas to a total flow amount of the boron containing gas, the silicon containing gas and the dilute gas is in a range from 1/40 to 1/2.5.

20. A semiconductor device, comprising a field effect transistor, wherein:
   the FET includes a metal gate structure,
   the metal gate structure includes:
      a gate dielectric layer including a high-k dielectric material;

a work function adjustment layer disposed over the gate dielectric layer;
a tungsten layer disposed over the gate dielectric layer;
an insulating cap layer disposed over the tungsten layer; and
sidewall spacers,
the tungsten layer contains boron, and
a boron concentration in the tungsten layer is in a range from 1 atomic % to 27 atomic %.

* * * * *